United States Patent [19]

Scifres et al.

[11] E Patent Number: Re. 31,806

[45] Reissued Date of Patent: Jan. 15, 1985

[54] MONOLITHIC MULTI-EMITTING LASER DEVICE

[75] Inventors: Donald R. Scifres, Los Altos; William Streifer; Robert D. Brunham, both of Palo Alto, all of Calif.

[73] Assignee: Xerox Corporation, Stamford, Conn.

[21] Appl. No.: 473,304

[22] Filed: Mar. 8, 1983

Related U.S. Patent Documents

Reissue of:

[64] Patent No.: 4,255,717
Issued: Mar. 10, 1981
Appl. No.: 956,307
Filed: Oct. 30, 1978

[51] Int. Cl.[3] ..... H01S 3/19

[52] U.S. Cl. ..... 372/50; 357/17; 372/45; 372/46

[58] Field of Search ..... 372/50, 45, 46, 24; 357/17

[56] References Cited

U.S. PATENT DOCUMENTS

| | | | |
|---|---|---|---|
| 3,340,479 | 9/1967 | Ashkin | 372/20 |
| 3,436,679 | 4/1969 | Fenner | 372/24 |
| 3,514,715 | 5/1970 | Kosonocky | 372/50 |
| 3,534,290 | 10/1970 | Fenner | 372/24 |
| 3,701,044 | 10/1972 | Paoli et al. | 372/50 |
| 3,702,975 | 11/1972 | Miller | 372/46 |
| 4,159,452 | 6/1979 | Logan et al. | 372/45 |

OTHER PUBLICATIONS

Pankove, "Integrated Phase Coherent Laser Array", *RCA Technical Notes*, RCATN No. 760 Apr. 1968, (2 pages).

*Primary Examiner*—James W. Davie
*Attorney, Agent, or Firm*—W. Douglas Carothers, Jr.

[57] ABSTRACT

A monolithic laser device produces a plurality of spatially displaced emitting cavities in an active layer of a semiconductor body acting as a waveguide for light wave propagation under lasing conditions. Various means are disclosed to deflect and directly couple a portion of the optical wave propagation into one or more different spatially displaced emitting cavities to improve coherence and reduce beam divergence.

57 Claims, 16 Drawing Figures

MONOLITHIC MULTI-EMITTING LASER DEVICE

Matter enclosed in heavy brackets [ ] appears in the original patent but forms no part of this reissue specification; matter printed in italics indicates the additions made by reissue.

BACKGROUND OF THE INVENTION

This invention relates generally in injection lasers and, more particularly, to heterostructure injection lasers having multi-emission capability.

Higher power outputs are being sought in semiconductor junction lasers to meet requirements necessary for optical fiber transmission, optical disk writing and integrated optical components and circuits. To achieve higher output powers from injection lasers, a wide contact stripe region has been proposed wherein stripe widths in excess of, for example, 20 μm, were employed in conventionally known double heterojunction and single heterojunction injection lasers. The width of the stripe was increased to spread the current density over a larger region of the light guiding layer of the device thereby spreading out the developed power by virtue of the larger emitting area. This also reduced the potential of structural damage and degradation of the laser device due to higher current and power densities established where narrower stripe geometries are employed.

Injection lasers have been known to have a stripe width of approximately 75 μm, achieving pulsed output powers of approximately 650 mW.

A disadvantage of these wide stripe lasers has been that transverse mode operation along the p-n junction plane is not stable. On one hand these broad stripe lasers operate in one or more higher order transverse modes exhibiting a broad divergence in the far field radiation pattern, which pattern may fluctuate with time or with driving current. On the other hand, multiple filaments may be simultaneously established in the pumped regions of the light guiding active layer resulting in uncontrolled optical interference fringes in the laser beam.

Greater power outputs have been realized where more than one contact stripe may be employed on the same laser device and if their stripe separation is small enough, optical coupling can be achieved due to transverse optical wave overlapping. This is disclosed in U.S. Pat. No. 3,701,044 and in Applied Physics Letters, Volume 17, Number 9, pages 371-373. With such overlapping, the two established lasers, upon pumping, operate in a phase-locked state. However, as indicated in these disclosures, several transverse modes were present so that stable beam output was not achieved.

It has already been known that with very narrow stripe geometry, such as 2 μm wide, lowest order or fundamental transverse mode can be achieved at least at current pumping levels near threshold. See Japanese Journal of Applied Physics, Volume 16, Number 4, April, 1977, pages 601-607. While such narrower stripe geometry may be used in a multistripe configuration, higher order transverse modes may appear at higher current levels and a variable range of beam divergence occurs in the far field pattern over a wide range of pumping currents.

OBJECT AND SUMMARY OF THE INVENTION

It is the general object of this invention to improve the power output level of semiconductor junction laser devices.

It is a further object of this invention to provide a monolithic laser device that has a plurality of emitting regions which provide a narrow beam divergence over a wide range of pumping currents.

In accordance with the present invention, means are provided to deflect and couple a portion of optical waves established in the active layer in a monolithic laser device into other spatially displaced regions of the active layer. Such means provides for a portion of the optical waves established in any one emitting region or cavity of the active layer to be deflected and coupled into one or more adjacent or spatially established emitting cavities of the active layer. This strong direct deflective coupling of light into other regions or into established emitting cavities in the active layer of the laser device provides for (1) better coherence resulting in lower beam divergence in the far field optical interference fringe pattern over a wide range of pumping currents and (2) more uniform simultaneous attainance of filament establishment among the several emitters for given current threshold.

By direct light deflective coupling, it is meant that some portion of the light wave is directly split off, stripped, redirected, steered or deflected from one emitting region of the active layer to an adjacent emitting region.

In all embodiments to be hereinafter described, the deflection means employed provides a refractive index change in the laser device, the effect of which is to provide direct light deflective coupling as just defined.

Direct light deflective coupling of the emitting cavities can be accomplished by interconnecting current confining geometry, or by interconnecting impurity profile, or by multichannel geometry in the substrate of the device, or by a deflection grating or by current confining geometry positioned at an angle relative the cleaved ends of the device.

Other objects and attainments together with a fuller understanding of the invention will become apparent and appreciated by referring to the following description and claims taken in conjunction with the accompanying drawings.

Figure 2:
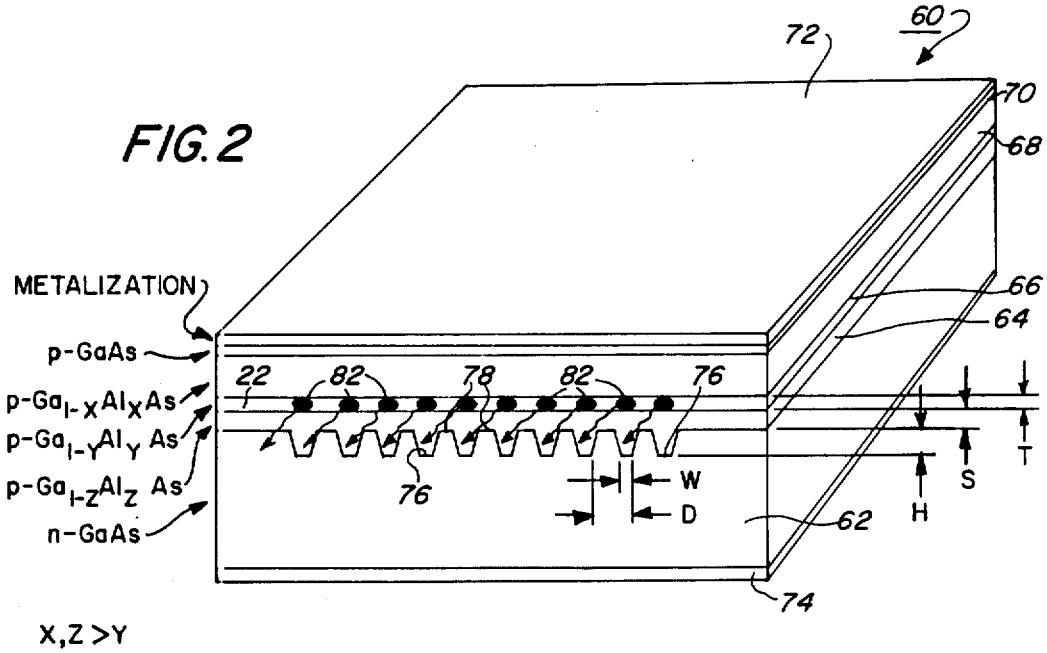
FIG. 2 is a perspective schematic diagram of a multichanneled substrate injection laser having multi-emitter capability and light deflection means according to the invention.

FIG. [2] *3* is a partial perspective view of the detail of the multi-channeled substrate of the laser shown in FIG. 2.

Figure 4:
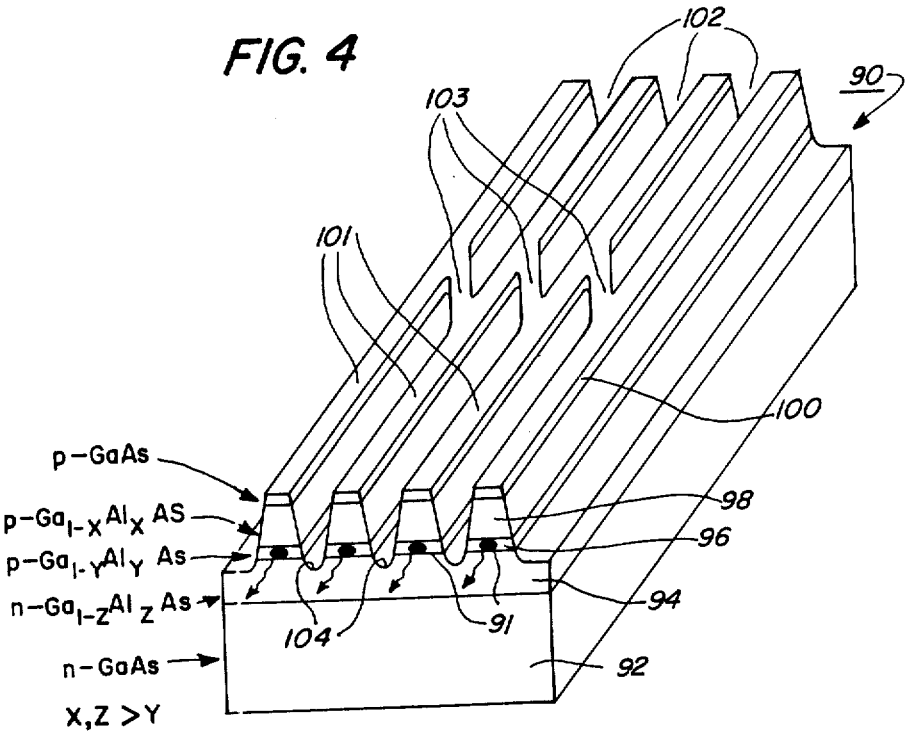

FIG. 4 is a perspective schematic diagram of a mesa injection laser having multi-emitter capability and light deflection means according to the invention.

Figure 5A:
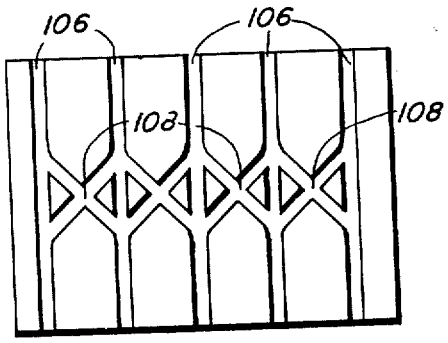
Figure 5B:
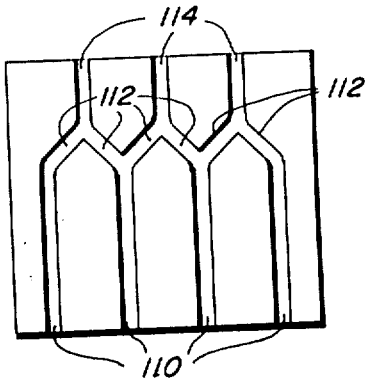
Figure 5C:
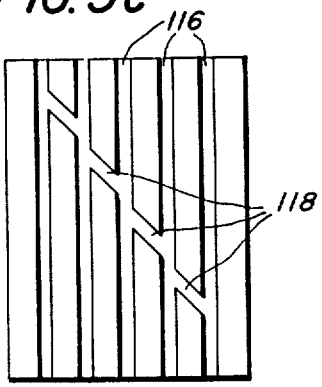
Figure 5D:
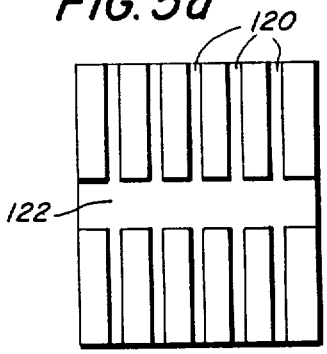
Figure 5E:
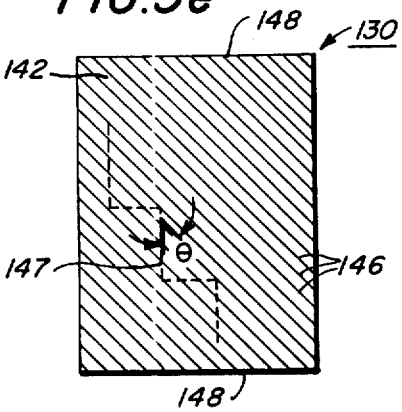
Figure 5G:
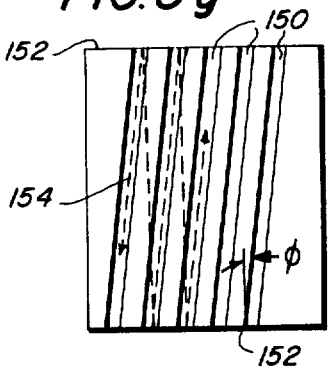
Figure 5F:
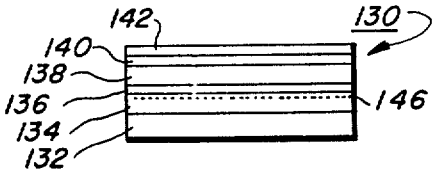

FIGS. 5a to 5h are schematic illustrations of different contact stripe geometries that may be employed as means to provide deflective optical coupling among multi-emitting cavities of a monolithic injection laser device. FIGS. 5e and 5f show, in addition, a deflection grating to accomplish such coupling.

Figure 1:
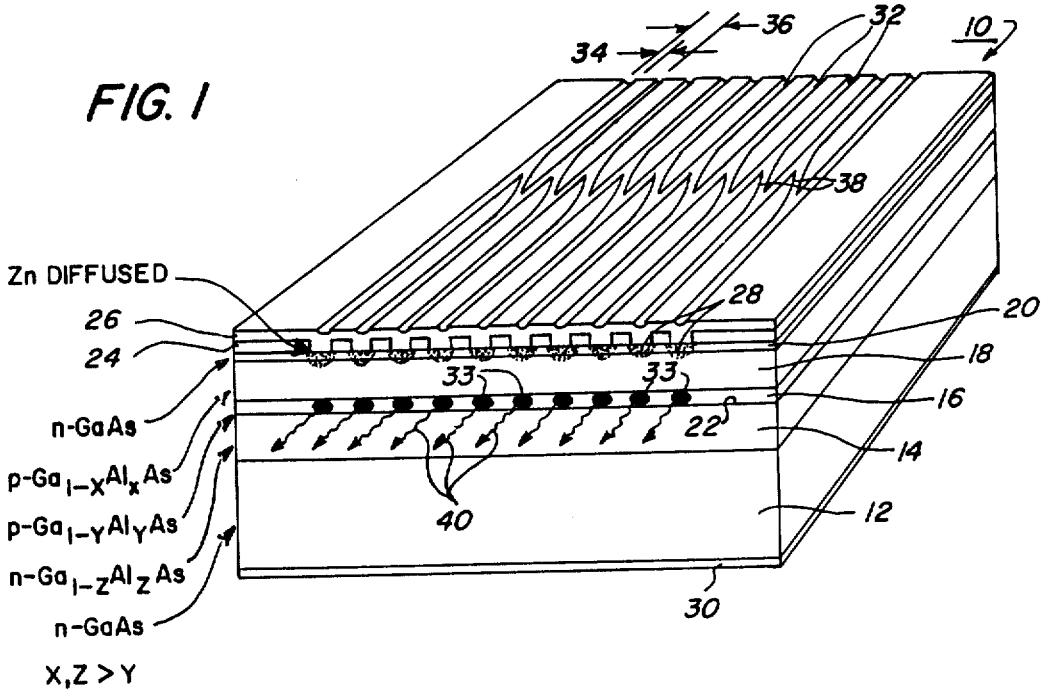
FIG. 1 is a perspective schematic diagram of a monolithic injection laser having multi-emitter capability with current confining means to provide direct light deflection according to the invention.
Figure 6:
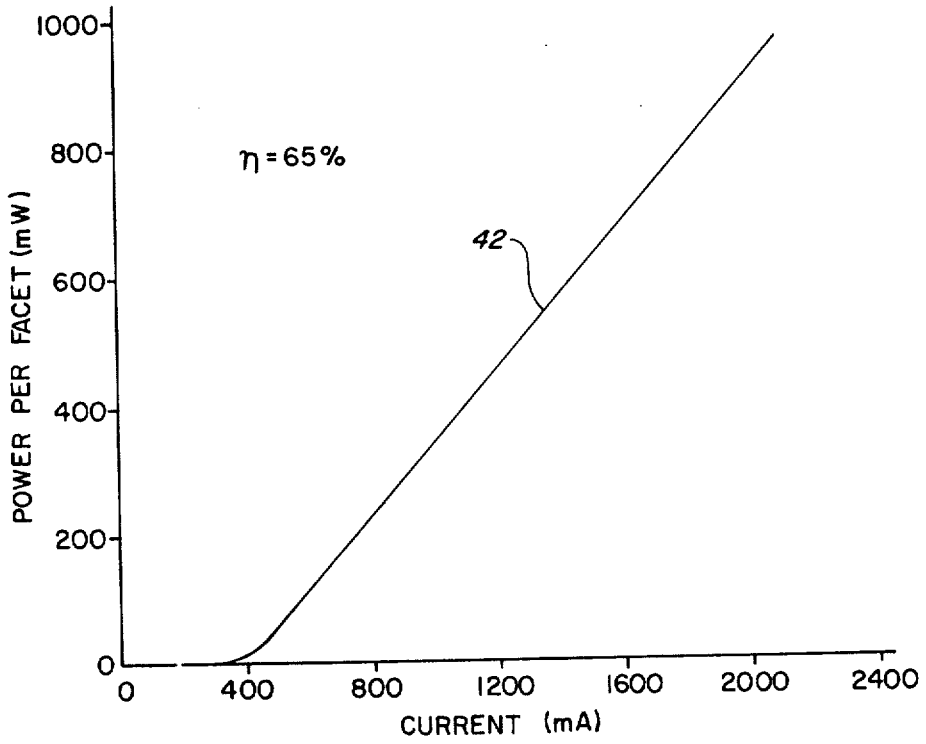

FIG. 6 illustrates the pulsed output power in milliwatts per facet for the laser shown in FIG. 1.

Figure 7:
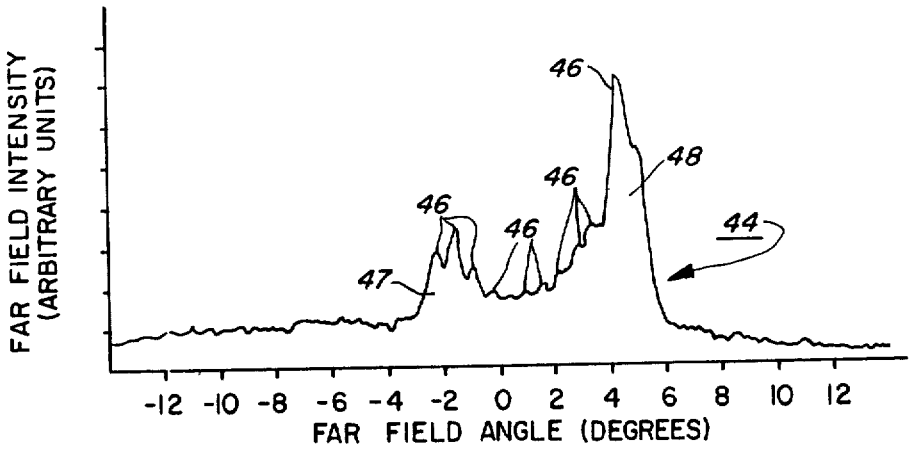

FIG. 7 illustrates the far field radiation pattern along the p-n junction plane for the laser shown in FIG. 1.

Figure 8:
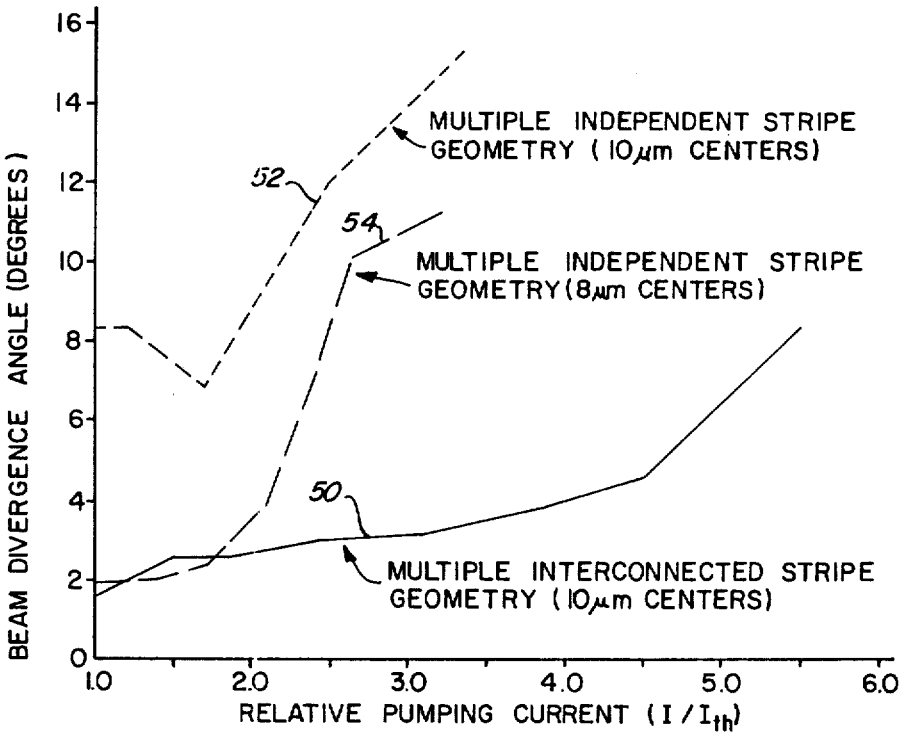

FIG. 8 illustrates the half power beam divergence angle along the p-n junction plane for several types of multi-emitter injection lasers, including the injection laser shown in FIG. 1, as a function of the ratio of driving current over threshold current.

DESCRIPTION OF THE PREFERRED EMBODIMENTS

The laser devices to be now described are of the double heterostructure type. However, the means of deflective light coupling disclosed may be included in other laser devices, such as, the distributed feedback type, the buried heterostructure type, the single heterostructure type, the homojunction type, the large optical cavity type, the twin guide type, the transverse junction stripe type or others well known in the art.

Referring to FIG. 1, there is schematically shown in monolithic laser device 10 in accordance with one illustrative embodiment of this invention. The fabrication of this device 10, as well as other laser structures hereinafter described, may be fabricated by liquid phase epitaxy, molecular beam epitaxy or metalorganic processes, which techniques are known in the art. Deposited on substrate 12 are layers 14, 16, 18 and 20 may comprise, respectively, n-GaAs; n-$Ga_{1-z}Al_zAs$; p-$Ga_{1-y}Al_yAs$, p-$Ga_{1-x}Al_xAs$ and n-GaAs, where x and z are greater than y and x and z may be equal. For example, layers 14 and 18 may be, respectively, n-$Ga_{0.65}Al_{0.35}As$ and p-$Ga_{0.65}Al_{0.35}As$ and layer 16 may be p-$Ga_{0.9}Al_{0.1}As$, making this the active layer with the highest index of refraction and the lowest bandgap to provide a waveguide for light wave propagation under lasing conditions along the plane of the p-n heterojunction 22. Layers 14, 18, 20 may be approximately 2 μm thick while active layer 16 may be 0.1 μm thick.

As well recognized in the art, the conductivity type of these layers may be reversed, which is also true for later described embodiments.

Fabrication of the device 10 is completed by depositing a silicon nitride layer 24 on layer 20. The desired contact stripe geometry is provided first by forming the geometry through a photolithographic mask by means of plasma etching. This is followed by zinc diffusion through n-type layer 24 into layer 18, as illustrated at 28 in FIG. 1. This diffusion helps confine the current during pumping.

Conductive layer 26 is then deposited on the selectively etched layer 24 to provide a metallization for electrode connection and current pumping. Layer 26 may be gold and chromium. Also the bottom surface of substrate 12 metallized to provide a contact for the other electrode connection. This deposited conductive layer 30 may be a gold-tin alloy.

After contact deposition, the ends of device 10 are cleaved to a desired length, such as 375 μm.

The current confining channel geometry shown in FIG. 1 comprises ten parallel contact stripes 32. The number of stripes 32 is significant from the point of desired power output. Increase in the number of stripes 32 will proportionally increase the optical power output. Also the higher the number of emitting cavities 33, the higher the obtainable peak power output and the lower the divergence angle of the resultant beam in the far field.

Upon current pumping of device 10, emitting cavities 33 are produced in active layer 16 below each contact stripe 32.

Stripe separation 36 from stripe center to center may typically be from 2 μm to 25 μm and stripe width 34 may be from 1 μm to 6 μm. Fabrication of the device of FIG. 1 has been done with stripe widths 34 of 3 μm and stripe separations 36 of 10 μm.

If the stripes 32 are closely spaced, that is approximately 8 μm or less, optical coupling will occur because the lateral extent of each fundamental transverse mode in the emitting cavities 33 under each contact stripe 32 will overlap to couple a portion of the light wave generated under one stripe 32 into an adjacent contact stripe 32. As a result, phase locking of the operating modes of all generated light waves in the active layer may occur.

However, coherence can be enhanced, reducing beam divergence and provide a higher power peak output beam by employing with the monolithic laser device 10, means to directly deflect and couple a portion of the optical wave developed in each of the lasing cavities produced in layer 16 into one or more adjacent cavities.

Such deflection means may take several forms, one of which is shown in FIG. 1. Each of the contact stripes 32 are directly coupled by interconnecting contact stripes 38. Interconnecting stripes 38 are provided in layer 24 during photolithographic and etching processes carried out for contact stripes 32.

The interconnecting stripes 38 may be curved as shown in FIG. 1 or may be lateral and straight. However, there are many other geometrical configurations, as will be explained later in connection with FIGS. 5*a* through 5*d*, that would provide suitable direct light deflective coupling.

The curved interconnecting contact stripes 38 may have, for example, a radius of curvature of 1 millimeter from one parallel contact stripe to an adjacent parallel contact stripe.

The curved interconnecting stripes 38 between adjacent stripes 32 provide very strong optical coupling between the emitting cavities 33 formed in active layer 16. The coupling is strong because portions of the optical wave in one particular cavity will split off and be deflected into different spatially displaced emitter cavities. Such wave portions may be deflected to an adjacent parallel cavity 33 or deflected into one or more additional spatially displaced cavities 33. This manner of deflection of optical wave portions of established optical waves in cavities 33 is also true for all other embodiments to be described hereinafter.

It is noted that contact stripes 32 need not necessarily be positioned close together to obtain fundamental mode overlapping to provide the benefits obtained by interconnecting contact stripes 38. The interconnecting stripes 38 provide deflective coupling of light to provide the improved structure without the need of close stripe geometry, such as, 8 μm or less. It is, however, beneficial to have narrower stripe widths 34 between 2 μm to 4 μm to stabilize fundamental mode operation.

Typical pumping operation of the laser device 10 may be at 300° K. with current pulses having a pulse width at 800 nanoseconds and a frequency at 10 KHz. Current thresholds, $I_{th}$, for the cavities 33 may range between 350 and 450 milliamps with threshold attained for all cavities 33 with 5% of initial threshold current for the first lasing emitting cavity.

Alternatively, rather current pumping, the laser device may operate with a greater duty cycle or continuous wave while employing a heat sink or thermo-electric cooler.

In summary, the multiple stripe layer device 10 provides current confinement defined by the contact stripes 32 and 38 for producing a plurality of light beams 40 in the near field and producing far field optical interference fringe pattern having improved high power and low beam divergence. With 10 cavities, it has been found that the power output is also approximately 10 times the power output of a single emitter cavity. The output power of approximately 1 watt at 65% differential quantum efficiency with far field divergence being within a few degrees over a wide range of pumping currents.

In FIG. 6, the power per facet versus pumping current characteristics are shown for the laser device 10 of FIG. 1. As shown, threshold current, $I_{th}$, is approximately 400 milliamps. The curve 42 is linear, exhibiting no current kinks, that is, abrupt changes in power output unpon uniform increase of pumping current.

In FIG. 7, the angular far field, optical interference fringe pattern 44 is shown for the output of the laser device 10 of FIG. 1. This pattern is generated by rotating an apertured light pipe in an arc parallel to and centered upon the p-n heterojunction 22. The operating current employed during the generation of pattern 44 was 420 milliamps, about 5% above threshold current. Of interest, is the fact that there are a plurality of peaks 46. The number of peaks 46 equals the number of emitting cavities 33 which indicates the phased locked operation of all of cavities 33.

Also, there are two major diffraction intensity lobes 47 and 48 separated by an angle of approximately 5.6°. These lobes are at approximately −2° and +4° and are different diffracted orders arising due to the periodic nature of the established emitter cavities 33. A minimum intensity point is observed at 0°. The emission of the largest lobe 48 is believed due to an inherent phase delay between adjacent cavities 33.

In FIG. 8 shows a comparison of the full half-power width, divergence angle for three different types of multi-emission laser devices as a function of pumping current. Curve 50 represents laser device 10 shown in FIG. 1 having interconnecting contact stripes 38. Curve 52 represents a laser structure similar to that shown in FIG. 1 except that there are no interconnecting contact stripes 38. The laser device for curve 52 has the same parallel stripe geometry as the device 10 of FIG. 1 where stripe width 34 is 3 μm and stripe separation 36 is 10 μm. Thus, any wave coupling and resulting phase locked operation depends solely on transverse mode wave overlapping and not on actual wave deflection and coupling accomplished in laser device 10.

Curve 54 also represents a laser structure similar to that shown in FIG. 1 but, like the laser device represented by curve 52, there are no interconnecting contact stripe geometry. The stripe geometry comprises a plurality of parallel contact stripes similar to contact stripes 32 but with a stripe width 34 of 3.5 μm and a stripe separation 36 of 8 μm. Here, overlapping of the transverse mode wave is much more pronounced because of smaller stripe separation as compared to the laser of curve 52.

In FIG. 8, the relative pumping current is represented by the ratio of actual pumping current, I, over threshold current, $I_{th}$.

The half power width, divergence angle is measured in the far field and is the angle in degrees measured from the cleaved facet of the laser device that subtends the half width output of the far field pattern of the type shown in FIG. 7. Of interest is the lower beam divergence of approximately 1.9° for laser device 10 at threshold current and maintaining a relatively low divergence angle (approximately 2° to less than 5°) over a wide range of pumping currents, i.e., up to about 4.5 times threshold current, $I_{th}$. On the other hand, the range of divergence angle for the laser devices represented by curves 52 and 54 were generally higher (except for curve 54 near threshold) and vary much more significantly over a wide range of pumping currents.

Also significant from FIG. 8 is the fact that, the smaller the optical coupling between emitting cavities, the less coherence and, therefore, the wider the beam divergence in the far field.

The establishment of emitting regions or cavities in the active layer of the laser device may be formed using other fabrication techniques. They can be formed by diffusion, ion implantation, chemical etching, preferential crystal growth, sputtering and ion beam milling.

Figure 1A:
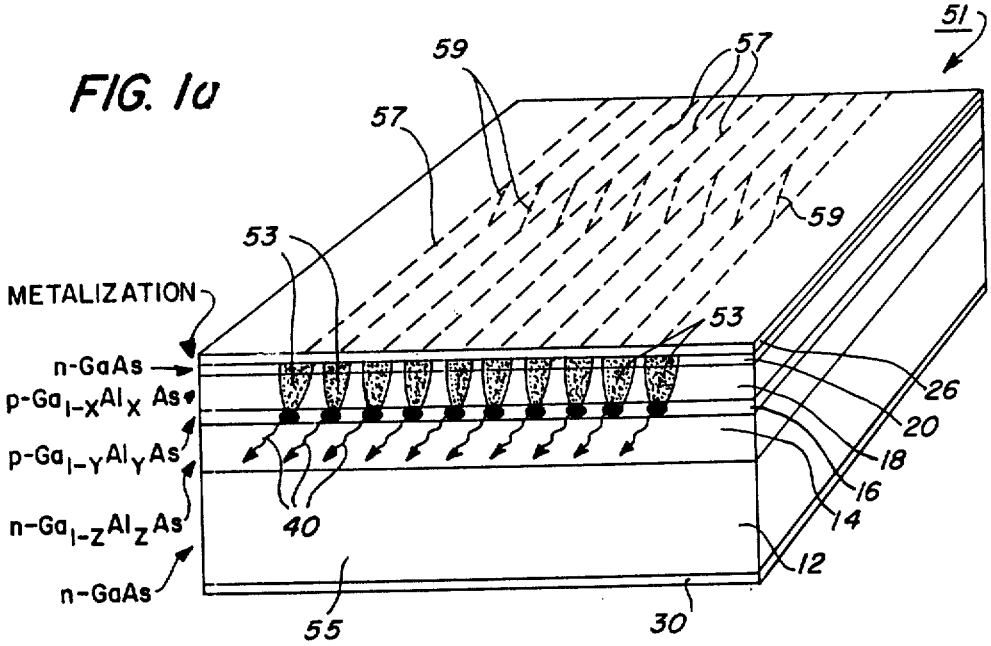
FIG. 1a is a perspective schematic diagram of a monolithic injection laser having multi-emitter capability with an impurity profile to provide direct light deflection according to the invention.

In FIG. 1a, the laser device 51 has the same substrate and fabricated layers as laser device 10 of FIG. 1, except that there is no silicon nitride layer 24 Contact layer 26 uniformly covers n-type layer 20. In order to provide waveguiding and create optical cavities 33 in the active layer 16, an impurity profile 53, such as a diffusion (zinc, for example) or ion implantation, may be extended through layer 18 to active layer 16. Profile 53 creates a refractive index change in the plane of layers 16 and 18. Profile 53 as illustrated at the facet 55 of laser device 51 extends throughout the device. The geometry of the profile is illustrated by dotted lines 57 on the surface of layer 26. Geometry 57 is the same as the geometry for the contact stripes 32, 38 shown in FIG. 1. The interconnection of geometry 57 at 59 illustrates the interconnecting impurity profile within laser device 51 to provide for direct light deflective coupling among the established emitting cavities 33.

The impurity profile 53 need only extend downwardly into laser device 51 to sufficiently permit the light wave established in emitting cavities 33 to overlap into and interact with the profile. The profile provides a change in refractive index (both real and imaginery) which stimulates and guides the light wave according to geometry 57. Interconnecting profiles at 59 provide a steering mechanism for portions of the propagating light wave to be deflected and coupled into one or more adjacent emitting cavities 33.

Referring to FIG. 2, laser device 60 comprises substrate 62 and sequentially deposited layers 64, 66, 68, 70 and 72. These layers may, respectively, comprise n-GaAs; n-$Ga_{0.65}Al_{0.35}As$; p-$Ga_{0.95}Al_{0.05}As$; p-$Ga_{0.65}Al_{0.35}As$; p-GaAs and layer of metalization of a gold-chromium alloy. A bottom metallic contact 74 may comprise a gold-tin alloy.

Figure 3:
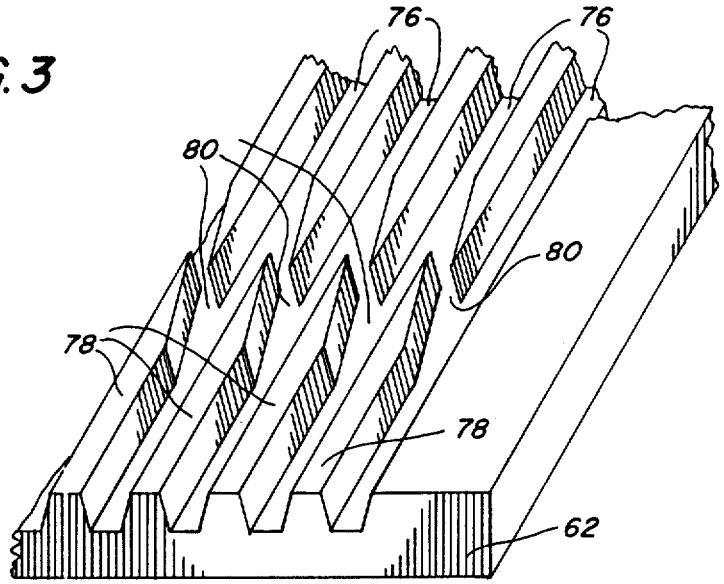

A plurality of parallel channels 76 are ion milled or etched into substrate 62 prior to growth or deposition of layers 62 through 72. Channel 76 provide mesas 78 therebetween. As best shown in FIG. 3, at a point along the length of the channels 76, there is provided a series of interconnecting channels 80 between adjacent channels 76. These interconnecting channels may be curved, as in the case of interconnecting stripes 38 of FIG. 1, or may be transversely disposed relative to channels 76 as illustrated in FIG. 3. What is important is that the channels 76 be interconnected in a manner to split off, deflect and guide a portion of developed optical wave from one emitter cavity 82 to one or more other adjacent cavities 82.

In laser device 60, T, the thickness of the active layer 66, may typically be 200A to 0.4 μm or greater; S, the thickness of layer 64 above mesas 78, may be 0.2 μm; H, the depth of channels 76, may be 1 μm; D, the periodic width of a channel-mesa combination, may be approximately 10 μm and W, the width of the channel basin, should be slightly less than D, such as, 8 μm or less.

Upon current pumping, the portions of the active layer 66 above the channels 76 will provide a waveguide for light wave propagation under lasing conditions and, thus, the establishment of emitter cavities 82. The channels 76 and mesas 78 provide in effect a transverse refractive index profile along the plane of the p-n junction 22. The regions above mesas 78 provide areas in layer 64 of less thickness compared to areas in layer 64 above channels 76. Light waves propagating in emitter cavities 82 are stabilized in the fundamental transverse mode in the areas above mesas 78 at the adjacent sides of the established cavities 82. Higher order modes do not oscillate because they are absorbed into these adjacent areas and the propagating wave is induced to stay within the confines of the cavity 82.

The same induced losses and light guiding is also obtained through interconnecting channels 80 so that portions of optical wave developed in any particular cavity 82 is split off and deflected into one or more adjacent cavities 82 bringing about phased locked operation and stronger coherence.

The laser device 90, shown in FIG. 4, is similar in semiconductor material and current channeling as shown in FIG. 1 except there are only four emitting cavities 91 rather than ten and the device is fabricated to provide spacing 102 between adjacent cavities. The fabrication of laser device 90 is as follows. Layers 92, 96, 98 and 100 are sequentially deposited using conventional techniques as previously indicated. No isolating or contact layers need be formed on layer 100. Using conventional photolithographic techniques, a mask is prepared on layer 100, exposed and thereafter controlled etching provides spacings 102. The depth 104 of spacings 102 is controlled to be established within layer 94 adjacent to active layer 96. The resulting structure appears as a plurality of parallel mesa structures 101 coupled by interconnecting mesa structures 103.

Appropriate contacts can be provided on layer 100 and on the bottom of substrate 92. The resulting structure, upon current pumping, will operate in the same manner as laser device 10. Spacings 102 provide better current confinement properties than possibly obtainable in connection with laser device 10 of FIG. 1.

The spacing 102 between provides for a medium, air, which has a low index of refraction than active layer 96. This spacing may also be filled with a semiconductor material deposited during a second sequence of growth. The material chosen should have a lower index of refraction than active layer 96.

It is of interest to mention at this point that the laser devices 10 and 90 provide current confining channels to establish the emitting cavities while laser device 51 provides a impurity profile to establish emitting cavities and laser device 60 provides a material thickness change to establish the emitting cavities. In any case, what is effectively being accomplished is a change in the refractive index (both the real and imaginary parts) at regions where the emitting cavities are created. The stripe geometry of laser device 10 can be combined with the identical channel geometry of laser device 60. Also, other types of current confining channels, such as, buried heterostructure geometry, buried stripe geometry, substrate stripe and implanted stripe, may be employed in the substrate of these laser devices to provide direct deflective coupling. Such buried stripe fabrication is disclosed in U.S. Pat. No. 4,099,999 issued July 11, 1978 and assigned to the assignee herein.

There are many ways of employing interconnecting current confining channel geometry as a means to deflect and couple portions of split off optical waves among the various emitting cavities. In FIGS. 5a through 5d, various examples of interconnecting geometry is illustrated. IN FIG. 5a, the parallel contact stripes 106 are interconnected by means of criss-cross interconnecting stripes 108. In this embodiment, deflection may occur in either direction of light wave propagation. In FIG. 5b, parallel contact stripes 110 are provided with curved sections 112 ending in a single stripe section 114. These sections 112 and 114 form a y-shaped interconnecting means. Curved sections 112 aid in establishing fundamental mode operation and provide means to split off and deflect portions of the developed optical wave into one or more adjacent cavities.

In FIG. 5c, the parallel contact stripes 116 are interconnected in an offset manner along the length of the device by transversely disposed interconnecting stripes 118. Each interconnecting stripe 118 is displaced relative to an adjacent interconnecting stripe 118 along the length of the laser device.

In FIG. 5d, the parallel contact stripes 120 are interconnected by a single transverse contact stripe 122. Stripe 122 has a larger width than individual stripes 120 and may be disposed laterally at an angle across stripes 120 as well as perpendicular thereto as shown in the Figure.

The laser device 130 shown in FIGS. 5e and 5f illustrates the use of a grating as a means of splitting off and deflecting a portion of the established light wave in the active layer into other regions of the active layer. Rather than establishing emitting cavities in the active layer, the entire active layer is pumped. However, parallel contact stripes could be provided on the surface of the device 130 to establish separate emitting cavities and the grating used to deflect and couple light waves from one or more cavities into one or more other adjacent cavities.

Structurally, laser device 130 may be similar to laser device 10 in FIG. 1, i.e., layers 132, 134, 136, 138 140, and 142 of device 130 are comparable to layers 12, 14, 16, 18, 20 and 26 of device 10. Contact layer 142 covers the entire surface of device 130. A grating pattern 146 is provided, for example in layer 134, adjacent to active layer 136, to deflect and couple portions of an established optical light wave in one region of the active layer into other regions of the active layer 136 in a manner depicted by arrow 147.

The grating pattern 146 may be disposed at 45° relative to the cleaved ends 148 of the device 130. However, other angles may be used as well. The grating period Λ is given by $\Lambda = p\lambda o \sin\theta / n_{eff}$ where $\lambda_o$ is the free space laser wavelength, $\theta$ is the angle of the grating relative to the lasing beam path, $n_{eff}$ is the effective refractive index seen by the laser light and p is an integer. If the grating is at 45° to the beam direction and if the laser operates at 8000A with $n_{eff}=3.6$, a grating period of integer multiples of 1571A may be used.

In FIG. 5g, the plurality contact stripes 150 are positioned at an offset angle $\phi$ relative to the longitudinal length of the laser device. The angularity of the stripes 150 is exaggerated for purposes of explanation. In practice, this angle may be 1° with the contact stripes having a 2 $\mu$m width and an 8 $\mu$m separation from stripe center to center. The length of the device may be approximately 250 $\mu$m.

A portion of the optical wave propagating along an emitting cavity of the active layer will be deflected, upon light beam reflection at either cleaved facet 152 of the device, into an adjacent emitting cavity. This is because the angle of incidence of the optical wave is not normal to the cleaved facets so that a portion of the optical wave will be reflected from the mirror surfaces of facets 152 into an adjacent cavity as depicted by arrow 154.

Figure 5H:
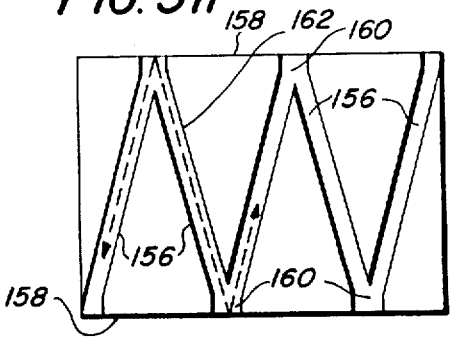

In FIG. 5h, the contact stripes 156 are not parallel but positioned angularly relative to each other in a manner that a portion of the light wave incident to the cleaved facet 158 is reflected and coupled into an adjoining emitting cavity. This deflective coupling is accomplished by interconnected stripe geometry 160 at the ends of stripes 156. Arrow 162 represents portions of light deflected from one established emitting cavity to an adjoining cavity.

In this embodiment as well as other embodiments of FIGS. 5, rather than employing current confining channels, such as, contact stripes 158, a diffused or implanted material composition change providing a refractive index profile corresponding to such channel geometry sufficiently diffused and implanted into the device to effectively interact with the light wave will also produce the direct light deflective coupling provided by these channel geometries.

Although in all the foregoing illustrations, the means to provide deflective coupling have been illustrated in an equally spaced manner, they may be positioned to have variable or unequal spacing to provide beam focusing or to provide side lobe suppression thereby enhancing the fundamental lobe (such as, lobe 48 at +4° in FIG. 7) in the far field.

Also, the current confining channels need not be defined by oxide or contact stripes as shown in the Figures. Any other well known current confining technique such as ion implantation, diffusion, substrate stripes, planar stripes, mesa stripe, internal strip transverse junction stripe etc. may be used.

Also, as shown in the Figures the deflective means for coupling light from one region of the active layer to another has been shown to be present near or within the active layer. However, the deflective means could be removed from close proximity to the active layer by coupling light from the active layer into a transparent waveguide layer. A number of methods for coupling light into transparent waveguide layers such as twin guide lasers, taper coupled lasers and others are well known in the art. Once in the transparent waveguide, the light deflective means such as is provided by a refractive index change could be used to deflect the light back into other spatially displaced regions of the active layer thus allowing for strong optical coupling of spatially separated regions of the active layer.

Although all the foregoing embodiments have been described in connection with semiconductor materials of GaAs and GaAlAs, other light emitting materials may be employed, such as InGa, AsP, GaAlP, GaAlSb, and PbSnTe.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

We claim:

1. In a monolithic laser device wherein one or more layers of semiconductor material are fabricated on a substrate, one of said layers forming [an] active [layer] *means* for light wave propagation and generation under lasing conditions, means for forward biasing said active [layer] *means* to produce a plurality of adjacent, *linear* light propagating and emitting portions therein, light guiding regions in said device *intermediate of the ends of and* nonlinear relative to said emitting portions whereby [said] *the* light waves produced in one portion of said active [layer] *means* are deflected and coupled into one or more adjacent emitting portions of said active [layer] *means*, said regions provided by a refractive index change with which [said] *the* light wave interacts while [said light wave is] within said regions and wherein said refractive index change is provided by the injected charge distribution determined by current confining means.

2. In a monolithic laser device wherein one or more layers of semiconductor material are fabricated on a substrate, one of said layers forming [an] active [layer] *means* for light wave propagation and generation under lasing conditions, means for forward biasing said active [layer] *means*, means in *and intermediate of the ends of* said device whereby [said] *the* light waves produced in one portion of said active [layer] *means* are deflected into one or more adjacent emitting portions of said active [layer] *means*, said deflection means provided by a refractive index change with which [said] *the* light wave interacts while [said light wave is] within said deflection means and wherein said refractive index change is provided by an impurity profile.

3. The device of claim 2 wherein said impurity profile defines a plurality of *linear* optical cavities, said cavities being coupled to one or more adjacent cavities by an interconnecting cavity formed by said profile.

4. The device of claim 3 wherein said optical cavities are angularly disposed relative to each other.

5. The device of claim 3 wherein said optical cavities are parallel.

6. The device of claim 3 wherein said optical cavities are unequally spaced relative to each other.

7. The device of claim 3 wherein some of said optical cavities are unequally spaced.

8. The device of claim 3 wherein all of said optical cavities are equally spaced relative to each other.

9. In a monolithic laser device wherein one or more layers of semiconductor material are fabricated on a substrate, one of said layers forming [an] active [layer] *means* for light wave propagation and generation under lasing conditions, means for forward biasing said active [layer] *means*, means in *and intermediate of*

*the ends of* said device whereby [said] *the* light waves produced in one portion of said active [layer] *means* are deflected into one or more adjacent emitting portions of said active [layer] *means* , said deflection means provided by a refractive index change with which [said] *the* light wave interacts while [said light wave is] within said deflection means and wherein said deflection means is a plurality of current confining channels, each of said current confining channels being coupled to an adjacent channel by an interconnecting current confining channel.

10. The device of claim 9 wherein said current confining channels are contact stripes.

11. The device of claim 9 wherein said current confining channels are angularly disposed relative to each other.

12. The device of claim 9 wherein said current confining channels are parallel.

13. The device of claim 9 wherein said current confining channels are unequally spaced relative to each other.

14. The device of claim 9 wherein some of said current confining channels are unequally spaced.

15. The device of claim 9 wherein all of said current confining channels are equally spaced relative to each other.

16. In a monolithic laser device wherein one or more layers of semiconductor material are fabricated on a substrate, one of said layers forming [an] active [layer] *means* for light wave propagation and generation under lasing conditions, means for forward biasing said active [layer] *means* , means in *and intermediate of the ends of* said device whereby [said] *the* light waves produced in one portion of said active [layer] *means* are deflected into one or more adjacent emitting portions of said active [layer] *means* , said deflection means provided by a refractive index change with which [said] *the* light wave interacts while [said light wave is] within said deflection means and wherein said refractive index change is provided by a material composition change.

17. The device of claim 16 wherein the material composition change defines a plurality of *linear* optical cavities, said cavities being coupled to one or more adjacent cavities by an interconnecting cavity formed by said material composition change.

[18. The device of claim 17 wherein said optical cavities are angularly disposed relative to each other.]

19. The device of claim 17 wherein said optical cavities are parallel.

20. The device of claim 17 wherein said optical cavities are unequally spaced relative to each other.

21. The device of claim 17 wherein some of said optical cavities are unequally spaced.

22. The device of claim 17 wherein all of said optical cavities are equally spaced relative to each other.

23. In a monolithic laser device wherein one or more layers of semiconductor material are fabricated on a substrate, one of said layers forming [an] active [layer] *means* for light wave propagation and generation under lasing conditions, means for forward biasing said active [layer] *means* , means in *and intermediate of the ends of* said device whereby [said] *the* light waves produced in one portion of said active [layer] *means* are deflected into one or more adjacent emitting portions of said active [layer] *means* , said deflection means provided by a refractive index change with which [said] *the* light wave interacts while [said light wave is] within said deflection means and wherein said refractive index change is provided by a material thickness change.

24. The device of claim 23 wherein a plurality of interconnecting channels are provided in said substrate to provide said material thickness change.

25. The device of claim 23 wherein the material thickness change defines a plurality of *linear* optical cavities, said cavities being coupled to one or more adjacent cavities by an interconnecting cavity formed by said material thickness change.

[26. The device of claim 25 wherein said optical cavities are angularly disposed relative to each other.]

27. The device of claim 25 wherein said optical cavities are parallel.

28. The device of claim 25 wherein said optical cavities are unequally spaced relative to each other.

29. The device of claim 25 wherein some of said optical cavities are unequally spaced.

30. The device of claim 25 wherein all of said optical cavities are equally spaced relative to each other.

31. In a monolithic laser device wherein one or more layers of semiconductor material are fabricated on a substrate, one of said layers forming [an] active [layer] *means* for light wave propagation and generation under lasing conditions, current confining means for forward biasing selected portions of said active [layer] *means* to produce two or more *linear and spatially disposed* lasing and *light* emitting cavities in said active [layer] *means* , and a light coupling region between said *linear light emitting* cavities to deflect a portion of the light wave propagation in one cavity to one or more adjacent emitting cavities.

32. In a monolithic laser device wherein one or more layers of semiconductor material are fabricated on a substrate, one of said layers forming [an] active [layer] *means* for light wave propagation and generation under lasing conditions, a plurality of current confining means for forward biasing selected portions of said active [layer] *means* to produce a plurality of *linear light* emitting cavities therein, and light deflecting means *intermediate of the ends of said cavities and* coupling each of said current confining means to one or more adjacent current confining means wherein said current confining means comprises a plurality of parallel contact stripes on the surface thereof, each of said stripes being coupled to an adjacent stripe by an interconnecting stripe means.

33. The device of claim 32 wherein said interconnecting stripe means are curved stripe sections.

34. The device of claim 32 wherein said interconnecting stripe means are transversely disposed stripe sections.

35. The device of claim 34 wherein said sections are geometrically staggered relative to each other along the length of said device.

36. The device of claim 32 wherein said interconnecting stripe means are criss-crossing stripe sections.

37. The device of claim 32 wherein said interconnecting stripe means comprises a single wide contact stripe transversely disposed relative to said parallel [contract] *contact* stripes, said transversely disposed stripe being several times wider than said parallel contact stripes.

38. The device of claim 37 wherein said transversely disposed stripe is perpendicular to said parallel contact stripes.

39. The device of claim 32 wherein said interconnecting stripe means comprises a y-shape stripe configuration connecting the ends of a pair of said parallel contact stripes at one end of said device.

40. The device of claim 32 wherein said contact stripes are disposed at an angle relative to the longitudinal axis of said device.

41. The device of claim 32 wherein said current confining means comprises a plurality of contact stripes on the surface thereof, said stripes being angularly disposed relative to each other and said interconnecting stripe means connecting the ends of adjacently disposed contact stripes.

42. In a monolithic laser device wherein one or more layers of semiconductor materials are fabricated on a substrate, one of said layers forming [an] active [layer] *means* for light wave generation and propagation, means for forward biasing said active [layer] *means* to produce a light wave in at least one linear light propagating region of said active [layer] *means* and an adjacent light guiding region *intermediate of the ends of and* coupled to said one region to deflect and couple a portion of said light wave in said one region into other such regions formed in said active [layer] *means* which are linear and spatially displaced from said one region.

43. In a monolithic laser device wherein one or more layers of semiconductor materials are fabricated on a substrate, one of said layers forming [an] active [layer] *means* for light wave generation and propagation, means for forward biasing said active [layer] *means* to produce a light wave in at least one region of said active [layer] *means* and means to deflect and couple a portion of said light wave in said one region into other regions of said active [layer] *means* spatially displaced from said one region and wherein said first and second mentioned means include means to confine current to selected portions of said active layer to produce multiple *linear light* emitting cavities.

44. In a monolithic laser device wherein laser device wherein one or more layers of semiconductor materials are fabricated on a substrate, one of said layers forming [an] active [layer] *medium* for light wave generation and propagation, means for forward biasing said active [layer] *medium* to produce a light wave in at least one region of said active [layer] *medium* and means to deflect and couple a portion of said light wave in said one region into other regions of said active [layer] *medium* spatially displaced from said one region and wherein said first mentioned means comprises a plurality of current confining channels, said second mentioned means comprises a plurality of interconnecting current confining channels *intermediate of the ends of the ends of said regions.* .

45. The device of claim 44 wherein said current confining channels comprises a plurality of spaced stripes, said interconnecting current confining channels comprise a plurality of interconnecting stripes, at least one such interconnecting stripe being disposed between adjacent stripes.

46. In a monolithic laser device wherein one or more layers of semiconductor materials are fabricated on a substrate, one of said layers forming [an] active [layer] *medium* for light wave generation and propagation, means for forward biasing said active [layer] *medium* to produce a light wave in at least one region of said active [layer] *medium* and means to deflect and couple a portion of said light wave in said one region into other regions of said active [layer] *medium* spatially displaced from said one region and wherein said first mentioned means comprises a plurality of spaced mesa structures including [all] *portions* of said layers *and said active medium* , said mesa structures separated from each other by a medium of lower refractive index than said active [layer] *medium* , and said second mentioned means comprises a plurality of interconnecting mesa structures *intermediate of the ends of said mesa structures* , at least one such interconnecting mesa structure being disposed between adjacent mesa structures.

47. In a monolithic laser device wherein one or more layers of semiconductor materials are fabricated on a substrate, one of said layers forming [an] active [layer] *medium* for light wave generation and propagation, means for forward biasing said active [layer] *medium* to produce a light wave in at least one region of said active [layer] *medium* and means to deflect and couple a portion of said light wave in said one region into other regions of said active [layer] *medium* spatially displaced from said one region and wherein said first mentioned means comprises a plurality of spaced channels in the surface of said substrate, said second mentioned means comprises a plurality of interconnecting channels in said substrate *intermediate of the ends of the ends of said spaced channels* , at least one such interconnecting channel being disposed between adjacent channels.

48. In a monolithic laser device wherein one or more layers of semiconductor materials are fabricated on a substrate, one of said layers forming [an] active [layer] *means* for light wave generation and propagation, means for forward biasing said active [layer] *means* to produce a light wave in at least one region of said active [layer] *means* and means to deflect and couple a portion of said light wave in said one region into other regions of said active [layer] *means* spatially displaced from said one region and wherein said [second] *third* mentioned means is a periodic grating disposed in said layers such that said light wave interacts with said grating being at an angle relative to the direction of light wave propagation.

49. In a monolithic laser device wherein one or more layers of semiconductor materials are fabricated on a substrate, one of said layers forming [an] active [layer] *medium* for light wave generation and propagation, means for forward biasing said active [layer] *medium* to produce a light wave in at least one region of said active [layer] *medium* and means to deflect and couple a portion of said light wave in said one region into other regions of said active [layer] *medium* spatially displaced from said one region and wherein said first mentioned means comprises a plurality of current confining channels, said second mentioned means characterizes said current confining channels as each being disposed at an angle relative to the longitudinal axis of said device.

50. The device of claim 49 wherein said current confining channels are parallel.

51. The device of claim 49 wherein said current confining channels are angularly disposed relative to each other and coupled to an adjacent current confining channel by interconnecting channel means.

52. The device of claims 49, 50 or 51 wherein said current confining channels are contact stripes.

53. In a monolithic laser device wherein one or more layers of semiconductor materials are fabricated on a substrate, one of said layers forming [an] active

[layer] *means* for light wave generation and propagation, means for forward biasing said active [layer] *means* to produce a light wave in at least one region of said active [layer] *means* and means to deflect and couple a portion of said light wave in said one region into other regions of said active [layer] *means* spatially displaced from said one region and wherein said regions are impurity in said device, said impurity profile defining a plurality of *linear* optical cavities, said *linear optical* cavities being coupled to one or more adjacent cavities by an interconnecting cavity formed by said profile *and intermediate of the ends of said cavities* .

*54. The device of claim 31 wherein said linear cavities are coupled by said light coupling regions intermediate of the ends of said linear cavities.*

*55. The device of claim 31 wherein said linear cavities are angularly disposed relative to adjacent, linear cavities and are coupled to said adjacent, linear cavities by said light coupling regions at the ends of said cavities.*

*56. The device of claim 43 wherein said linear emitting cavities are coupled by said deflection means intermediate of the ends of said linear emitting cavities.*

*57. The device of claim 43 wherein said linear emitting cavities are angularly disposed relative to adjacent, linear cavities and are coupled to said adjacent, linear cavities by said deflection means at the ends of said cavities.*

* * * * *